United States Patent
Wang et al.

(10) Patent No.: US 11,777,016 B2
(45) Date of Patent: Oct. 3, 2023

(54) METHOD OF FORMING BACKSIDE POWER RAILS

(71) Applicant: Taiwan Semiconductor Manufacturing Company, Ltd., Hsinchu (TW)

(72) Inventors: Ping-Wei Wang, Hsin-Chu (TW); Chih-Chuan Yang, Hsinchu (TW); Yu-Kuan Lin, Taipei (TW); Choh Fei Yeap, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/811,266

(22) Filed: Jul. 7, 2022

(65) Prior Publication Data
US 2022/0336641 A1 Oct. 20, 2022

Related U.S. Application Data

(63) Continuation of application No. 17/037,274, filed on Sep. 29, 2020, now Pat. No. 11,411,100.

(51) Int. Cl.
*H01L 29/66* (2006.01)
*H01L 29/40* (2006.01)
(Continued)

(52) U.S. Cl.
CPC .... *H01L 29/66795* (2013.01); *H01L 23/5286* (2013.01); *H01L 24/83* (2013.01); *H01L 29/401* (2013.01); *H01L 29/41733* (2013.01); *H01L 29/41791* (2013.01); *H01L 29/42392* (2013.01); *H01L 29/775* (2013.01);
(Continued)

(58) Field of Classification Search
CPC .......... H01L 29/66795; H01L 23/5286; H01L 24/83; H01L 27/11; H01L 29/401; H01L 29/41791; H01L 29/7853; H01L 2029/7858; H01L 2224/83097; H01L 2224/83099; H01L 2224/83896; H01L 29/41733; H01L 27/0886
See application file for complete search history.

(56) References Cited

U.S. PATENT DOCUMENTS 7,402,866 B2 * 7/2008 Liang ................ H01L 29/41766
257/E29.121
11,195,930 B1 * 12/2021 Chen ................. H01L 29/42392
(Continued)

FOREIGN PATENT DOCUMENTS

CN 109906513 A 6/2019

*Primary Examiner* — Earl N Taylor
(74) *Attorney, Agent, or Firm* — HAYNES AND BOONE, LLP

(57) ABSTRACT

A semiconductor structure and a method of forming the same are provided. In an embodiment, a semiconductor structure includes a source feature and a drain feature, a channel structure disposed between the source feature and the drain feature, a semiconductor layer disposed over the channel structure and the drain feature, a dielectric layer disposed over the semiconductor layer, a backside source contact over the source feature and extending through the semiconductor layer and the dielectric layer, and a backside power rail disposed over the dielectric layer and in contact with the backside source contact.

20 Claims, 16 Drawing Sheets

(51) Int. Cl.
  *H01L 23/00* (2006.01)
  *H01L 29/78* (2006.01)
  *H01L 23/528* (2006.01)
  *H01L 29/417* (2006.01)
  *H01L 29/423* (2006.01)
  *H01L 29/786* (2006.01)
  *H01L 29/775* (2006.01)
  *H10B 10/00* (2023.01)

(52) U.S. Cl.
  CPC .... *H01L 29/7853* (2013.01); *H01L 29/78696* (2013.01); *H10B 10/00* (2023.02); *H01L 2029/7858* (2013.01); *H01L 2224/83097* (2013.01); *H01L 2224/83099* (2013.01); *H01L 2224/83896* (2013.01)

(56) References Cited

U.S. PATENT DOCUMENTS

| | | | |
|---|---|---|---|
| 11,201,221 B2* | 12/2021 | Morrow | H01L 29/41791 |
| 2006/0115943 A1* | 6/2006 | Koyanagi | H01L 29/66772 257/E29.295 |
| 2006/0115973 A1 | 6/2006 | Koyanagi | |
| 2007/0296002 A1* | 12/2007 | Liang | H01L 29/78 257/288 |
| 2011/0169084 A1* | 7/2011 | Yang | H01L 21/84 257/E21.415 |
| 2011/0241073 A1* | 10/2011 | Cohen | H01L 29/66742 438/151 |
| 2013/0130479 A1* | 5/2013 | Stuber | H01L 21/78 438/479 |
| 2013/0299897 A1* | 11/2013 | Doris | H01L 23/485 438/156 |
| 2013/0302950 A1* | 11/2013 | Doris | H01L 29/66636 438/151 |
| 2014/0332749 A1* | 11/2014 | Yokoyama | H01L 21/845 257/288 |
| 2020/0105759 A1* | 4/2020 | Bowonder | H01L 21/823871 |
| 2020/0176448 A1* | 6/2020 | Huang | H01L 21/823431 |
| 2020/0303509 A1* | 9/2020 | Mehandru | H01L 29/401 |
| 2021/0202385 A1* | 7/2021 | Huang | H01L 29/785 |
| 2021/0242322 A1* | 8/2021 | Liang | H01L 29/785 |
| 2021/0280683 A1* | 9/2021 | Trivedi | H01L 29/66795 |
| 2021/0351303 A1* | 11/2021 | Ju | H01L 29/66545 |
| 2021/0376093 A1* | 12/2021 | Chu | H01L 29/0847 |
| 2021/0391421 A1* | 12/2021 | Chu | H01L 21/823481 |

* cited by examiner

METHOD OF FORMING BACKSIDE POWER RAILS

PRIORITY DATA

This application is a continuation of U.S. patent application Ser. No. 17/037,274, filed Sep. 29, 2020, which is hereby incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given an MBC transistor alternative names such as a nanosheet transistor or a nanowire transistor.

As the dimensions of the multi-gate devices shrink, packing all contact features on one side of a substrate is becoming more and more challenging. To ease the packing density, it has been proposed to move some routing features, such as power lines (also referred to as power rails) to a backside of the substrate. Some processes for forming backside power rails require use of a silicon-on-insulator (SOI) substrate, which involves increased cost. Therefore, while conventional backside power rail formation processes may be generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
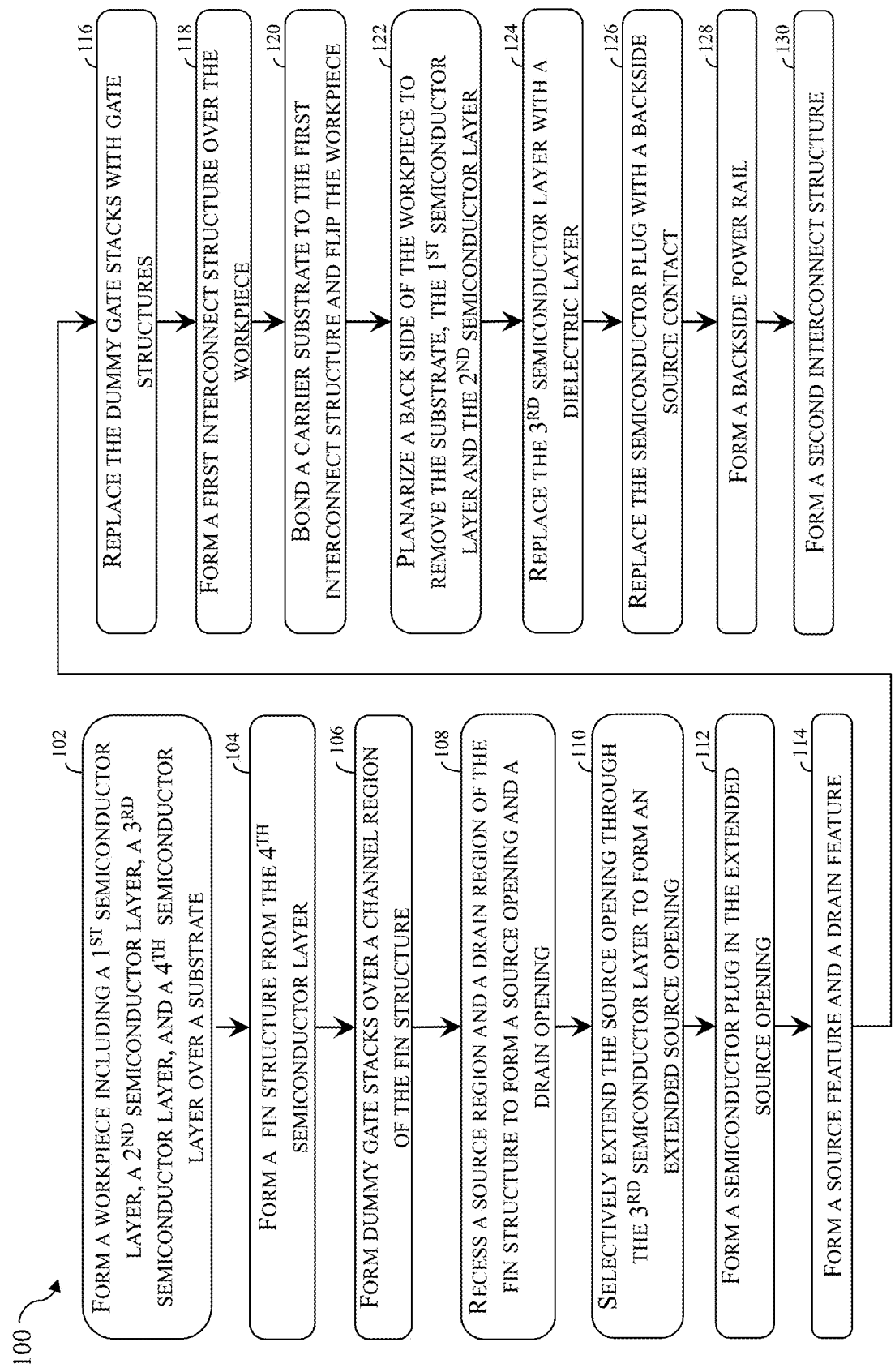
FIG. 1 illustrates a flow chart of a method for forming a semiconductor device having a backside power rail, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second feature s may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to methods of forming a semiconductor device having backside power rails, and more particularly to methods of forming a backside contact structure without using a silicon-on-insulator (SOI) substrate.

Conventionally, source/drain contacts and gate contacts of transistors on a substrate connect source/drain features of the transistors to an interconnect structure over a front side of the substrate. As the dimensions of IC devices shrink, the close proximity among the source contacts and gate contacts may reduce process windows for forming these contacts and may increase parasitic capacitance among them. The backside power rail (BPR) structure is a modern solution for performance boost on power delivery network (PDN) for advanced technology node and it eases the crowding of contacts. In some conventional processes, formation of backside power rails rely on use of an SOI substrate, where the buried insulator layer provides etch selectivity. In these conventional processes, the use of SOI substrates increases manufacturing cost. In addition, it may difficult to control the depth and boundaries of the buried insulator layer, resulting in process variations.

The present disclosure provides processes for forming a backside power rail structure without use of SOI substrates. In some embodiments, a composite substrate is formed by epitaxially depositing a first, a second, a third, and a fourth semiconductor layers over a substrate to predetermined depths in a controllable manner. A fin structure is formed from the fourth semiconductor layer of the composite substrate to form a workpiece. A source region and a drain region of the fin structure are recessed to form a source opening and a drain opening. Using photolithography techniques, the source opening is selectively extended through at least the third semiconductor layer to form an extended source opening. A semiconductor plug is then deposited into the extended source opening to extend through the third semiconductor layer. A drain feature is formed in the drain opening and a source feature is formed in the drain opening over the silicon plug. After forming the gate structures and an interconnect structure over a front side of the workpiece, the workpiece is bonded to a carrier substrate and flipped over. The substrate, the first semiconductor layer and the second semiconductor layer are removed by planarization to expose the semiconductor plug in the third semiconductor layer. The third semiconductor layer is then removed and replaced with a dielectric layer. Utilizing the etch selectivity between the dielectric layer and the semiconductor plug, the semiconductor plug is selectively removed to expose the source feature in a backside source contact opening. A backside source contact is then formed in the backside source contact opening. A backside power rail is then formed over the backside source contact.

The various aspects of the present disclosure will now be described in more detail with reference to the figures. In that regard, FIG. 1 is a flowchart illustrating method 100 of forming a semiconductor device according to embodiments of the present disclosure. Method 100 is merely an example and is not intended to limit the present disclosure to what is explicitly illustrated in method 100. Additional steps may be provided before, during and after the method 100, and some steps described can be replaced, eliminated, or moved around for additional embodiments of the method. Not all steps are described herein in detail for reasons of simplicity. Method 100 is described below in conjunction with FIGS. 2-13, which are fragmentary cross-sectional views of a workpiece 200 at different stages of fabrication according to embodiments of method 100. Because the workpiece 200 will be fabricated into a semiconductor device 200 upon conclusion of the fabrication processes, the workpiece 200 may be referred to as the semiconductor device 200 as the context requires.

Figure 2:
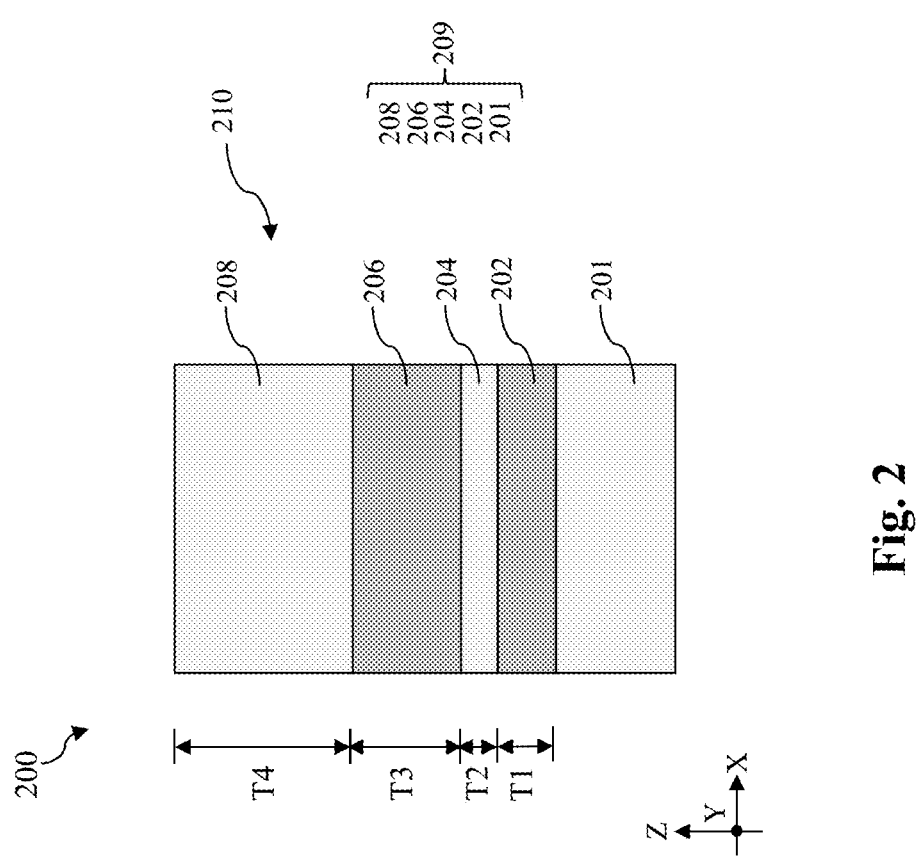
FIGS. 2-13 illustrate fragmentary cross-sectional views of a workpiece during a fabrication process according to the method of FIG. 1, according to one or more aspects of the present disclosure.

Referring to FIGS. 1 and 2, method 100 includes a block 102 where a composite substrate 209 is formed. In the depicted embodiment, the composite substrate 209 includes a substrate 201, a first semiconductor layer 202 over the substrate 201, a second semiconductor layer 204 over the first semiconductor layer 202, a third semiconductor layer 206 over the second semiconductor layer 204, and a fourth semiconductor layer 208 over the third semiconductor layer 206. In some embodiments, the substrate 201 may be a semiconductor substrate such as a silicon substrate. The substrate 201 may also include other semiconductor materials such as germanium, silicon carbide (SiC), silicon germanium (SiGe), or diamond. In an example process, each of the first semiconductor layer 202, the second semiconductor layer 204, the third semiconductor layer 206, and the fourth semiconductor layer 208 may be epitaxially deposited using molecular beam epitaxy (MBE), vapor-phase epitaxy (VPE), ultra-high vacuum CVD (UHV-CVD)), and/or other suitable epitaxial growth processes. Because deposition rates of the epitaxial deposition process for the semiconductor layers in the composite substrate 209 may be well controlled, thickness of the each of the semiconductor layers may be controlled by, for example, durations of deposition.

In one embodiment, the first semiconductor layer 202 and the third semiconductor layer 206 may share the same composition and the second semiconductor layer 204 and the fourth semiconductor layer 208 may share the same composition. For example, the first semiconductor layer 202 and the third semiconductor layer 206 are formed of silicon germanium (SiGe) while the second semiconductor layer 204 and the fourth semiconductor layer 208 are formed of silicon (Si). In an alternative embodiment, the third semiconductor layer 206 has a composition and the other semiconductor layers have a different composition. For example, the first semiconductor layer 202, the second semiconductor layer 204 and the fourth semiconductor layer 208 are formed of silicon (Si) while the third semiconductor layer 206 is formed of silicon germanium (SiGe).

In this embodiment represented in FIG. 2, the first semiconductor layer 202 has a first thickness (T1), the second semiconductor layer 204 has a second thickness (T2), the third semiconductor layer 206 has a third thickness (T3), and the fourth semiconductor layer 208 has a fourth thickness (T4). Depending on whether FinFETs or MBC transistors are desired, the fourth thickness (T4) may be between 50 nm and about 100 nm and serve to form the active regions of FinFETs or MBC transistors. The third semiconductor layer 206 is to be replaced with a dielectric layer and the third thickness (T3) defines the thickness of such dielectric layer. The third thickness (T3) is therefore smaller than the fourth thickness (T4) and may be between about 30 nm and about 35 nm. The second semiconductor layer 204 has a different etch selectivity than the third semiconductor layer 206 and functions as an etch stop layer. In addition, the second semiconductor layer 204 may serve as a CMP stop layer as it planarizes at a slower rate than the first semiconductor layer 202. Compared to the other layers, the second semiconductor layer 204 may be thin and may be between about 5 nm and about 15 nm. The first semiconductor layer 202 serves to introduce end point control in a CMP process to remove the substrate 201, the first semiconductor layer 202 and the second semiconductor layer 204. In some embodiments, the first thickness (T1) may be between 25 nm and about 30 nm.

Referring to FIGS. 1 and 2, method 100 includes a block 104 where a fin structure 210 is formed from the fourth semiconductor layer 208 of the composite substrate 209. For ease of reference, the composite substrate 209 and structures formed or to be formed thereon may be collectively referred to as a workpiece 200. To pattern the fourth semiconductor layer 208 to form the fin structure 210, a hard mask layer (not shown) may be deposited over the fourth semiconductor layer 208. The hard mask layer may be a single layer or a multilayer. In one example, the hard mask layer includes a silicon oxide layer and a silicon nitride layer over the silicon oxide layer. The fin structure 210 extends vertically along the Z direction from the composite substrate 209 and extends lengthwise along the X direction. The fin structure 210 may be patterned using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the fin structure 210 by etching the fourth semiconductor layer 208. The etching process can include dry etching, wet etching, reactive ion etching (RIE), and/or other suitable processes.

While not explicitly shown in FIG. 2, an isolation feature is also formed around the fin structure 210 to isolate the fin structure 210 from an adjacent fin structure. In some embodiments, the isolation feature is deposited in trenches that define the fin structure 210. Such trenches may extend through the fourth semiconductor layer 208 and a portion of the third semiconductor layer 206. That is, such trenches do not extend into the second semiconductor layer 204. It follows that the isolation feature also does not extend into the second semiconductor layer 204. The isolation feature may also be referred to as a shallow trench isolation (STI) feature. In an example process, a dielectric material for the isolation feature is deposited over the workpiece 200 using CVD, subatmospheric CVD (SACVD), flowable CVD, physical vapor deposition (PVD), spin-on coating, and/or other suitable process. Then the deposited dielectric material is planarized and recessed until the fin structure 210 rises above the isolation feature. The dielectric material for the isolation feature may include silicon oxide, silicon oxynitride, fluorine-doped silicate glass (FSG), a low-k dielectric, combinations thereof, and/or other suitable materials.

Figure 3:
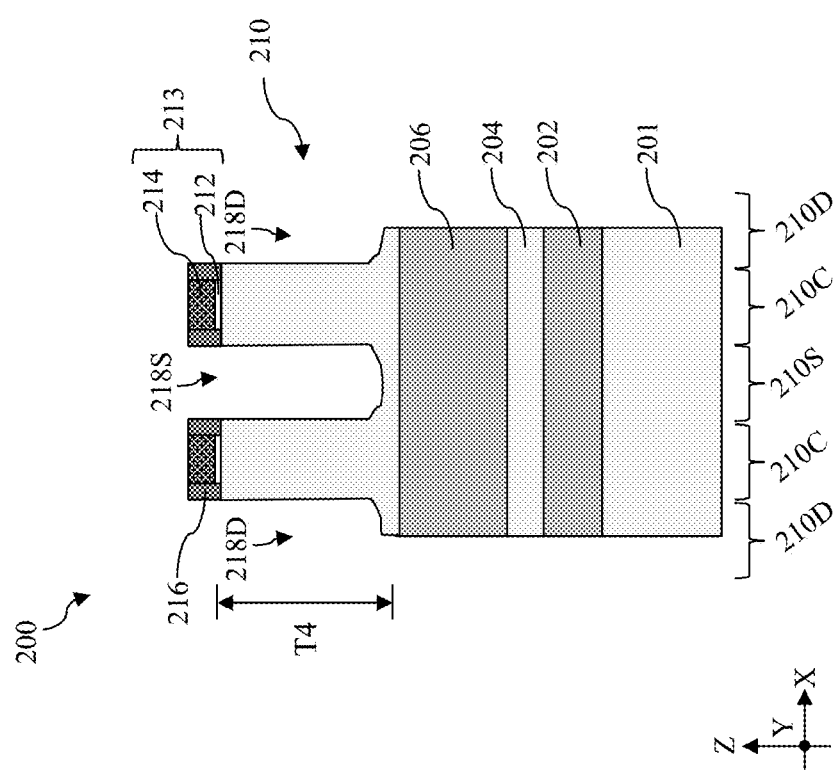

Referring to FIGS. 1 and 3, method 100 includes a block 106 where dummy gate stacks 213 are formed over a channel region 210C of the fin structure 210. In some embodiments, a gate replacement process (or gate-last process) is adopted where the dummy gate stacks 213 serve as placeholders for functional gate structures. Other processes and configuration are possible. To form the dummy gate stacks 213, a dummy dielectric layer 212, a dummy gate electrode layer 214, and a gate-top hard mask layer (not shown) are deposited over the workpiece 200. The deposition of these layers may include use of low-pressure CVD (LPCVD), CVD, plasma-enhanced CVD (PECVD), PVD, thermal oxidation, e-beam evaporation, or other suitable deposition techniques, or combinations thereof. The dummy dielectric layer 212 may include silicon oxide. The dummy gate electrode layer 214 may include polysilicon. The gate-top hard mask layer may be a multi-layer that includes silicon oxide and silicon nitride. Using photolithography and etching processes, the gate-top hard mask layer is patterned. The photolithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. The etching process may include dry etching (e.g., RIE etching), wet etching, and/or other etching methods. Thereafter, using the patterned gate-top hard mask as the etch mask, the dummy dielectric layer 212 and the dummy gate electrode layer 214 are then etched to form the dummy gate stack 213. As shown in FIG. 3, portions of the fin structure 210 underlying the dummy gate stacks 213 are channel region 210C. The channel regions 210C and the dummy gate stack 213 also define source regions 210S and drain regions 210D that are not vertically overlapped by the dummy gate stacks 213. Each of the channel regions 210C is disposed between a source region 210S and a drain region 210D along the X direction. Operations at block 106 also includes formation of a gate spacer layer 216 along sidewalls of the dummy gate stacks 213. In some embodiments, the formation of the gate spacer layer includes conformal deposition of one or more dielectric layers over the workpiece 200. In an example process, the one or more dielectric layers are deposited using CVD, SACVD, or ALD. The one or more dielectric layers may include silicon oxide, silicon nitride, silicon carbide, silicon oxynitride, silicon carbonitride, silicon oxycarbide, silicon oxycarbonitride, and/or combinations thereof.

Referring to FIGS. 1 and 3, method 100 includes a block 108 where a source region 210S and a drain region 210D of the fin structure 210 are recessed to form a source opening 218S and a drain opening 218D. After the deposition of the gate spacer layer 216, the dummy gate stacks 213 and the gate spacer layer 216 along sidewalls of the dummy gate stacks serve as an etch mask in an etch process that anisotropically etches the source regions 210S and the drain regions 210D of the fin structure 210. The anisotropic etching of the source regions 210S and the drain regions 210D results in source openings 218S and drain openings 218D, respectively. The etch process at block 108 may be a dry etch process or a suitable etch process. An example dry etch process may implement an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. As shown in FIG. 3, the source openings 218S and the drain openings 218D extend through a majority of the fourth thickness (T4) of the fourth semiconductor layer 208 but does not extend into the third semiconductor layer 206.

Figure 4:
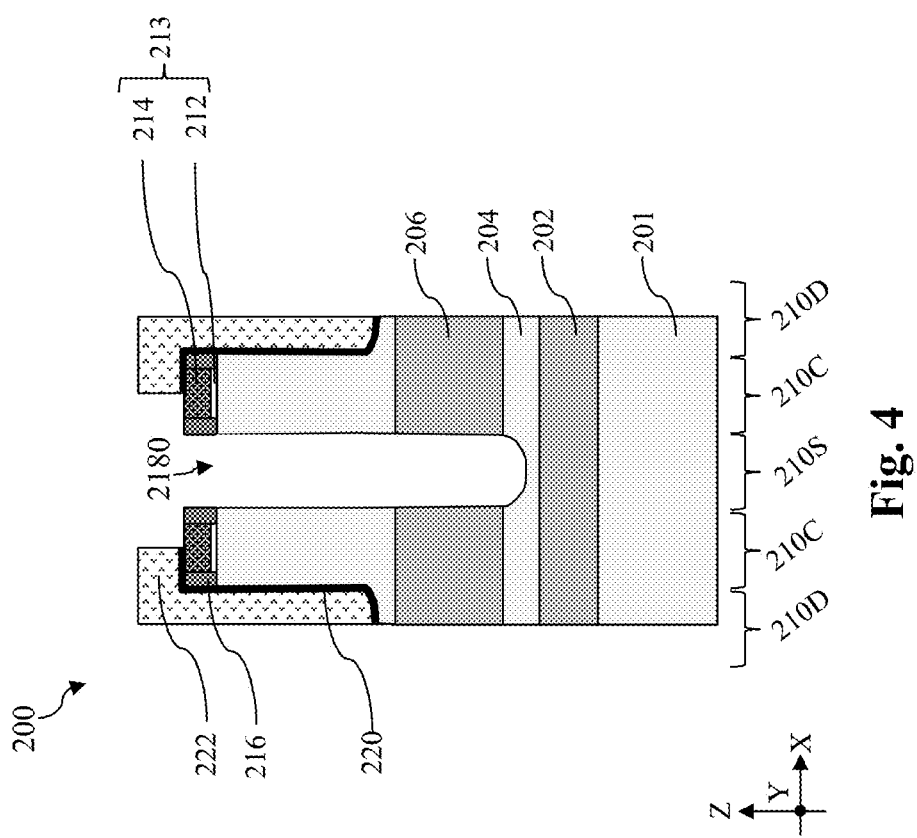

Referring to FIGS. 1 and 4, method 100 includes a block 110 where the source opening 218S is selectively extended through the third semiconductor layer 206 to form an extended source opening 218O. In some embodiments, a mask film 220 is deposited over the workpiece 200 using CVD or ALD and then a photoresist layer 222 is deposited over the mask film 220 using spin-on coating or a suitable process. The photoresist layer 222 is patterned using photolithography processes to form a patterned photoresist layer 222. The patterned photoresist layer 222 is then applied as an etch mask in an etch process to pattern the mask film 220. As shown in FIG. 4, the patterned photoresist layer 222 and the patterned mask film 220 cover/protect the drain openings 218D while the source opening 218S is exposed. An anisotropic etch process is then performed to extend the source opening 218S through the third semiconductor layer 206 and a portion of the second semiconductor layer 204 so as to form an extended source opening 2180. In some instances, the extended source opening 2180 may terminate in the second semiconductor layer 204. In some implementations, the anisotropic etch process at block 110 may be a dry etch process that uses an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In some embodiments, the mask film 220 may include silicon oxide, silicon nitride, silicon oxynitride, silicon oxycarbonitride, silicon carbide, or silicon oxycarbide.

Figure 5:
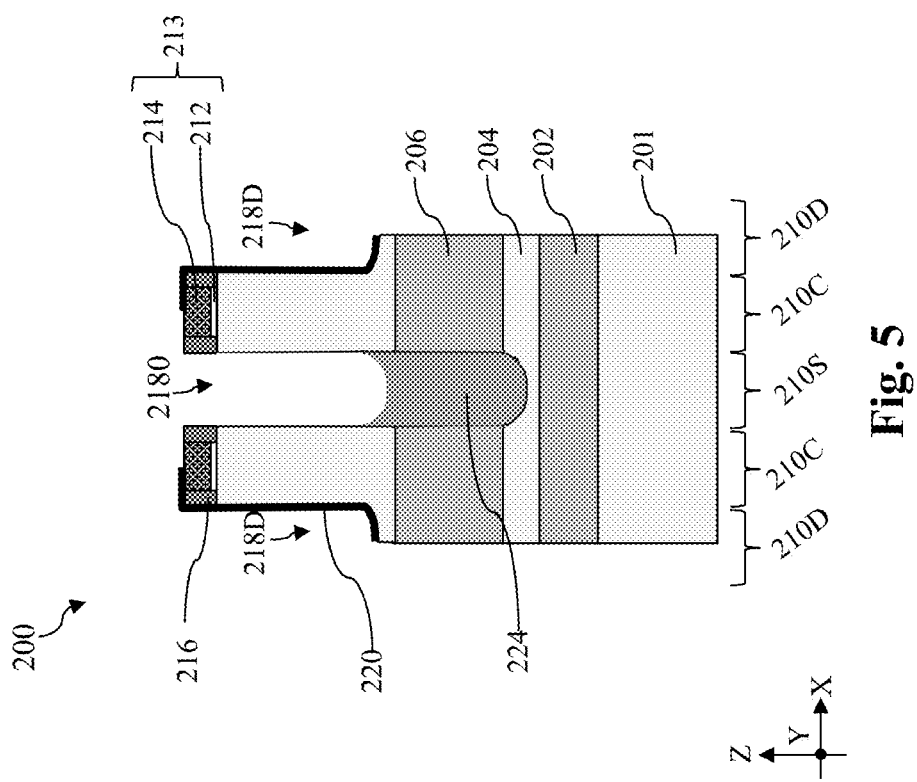

Referring to FIGS. 1 and 5, method 100 includes a block 112 where a semiconductor plug 224 is formed in the extended source opening 2180. In some embodiments, operations at block 112 may include a pre-clean process to remove native oxide and the photoresist layer 222. The pre-clean process may include use of RCA SC-1 (a mixture of ammonium hydroxide, hydrogen peroxide and water) and/or RCA SC-2 (a mixture of hydrochloric acid, hydrogen peroxide and water). After the pre-clean process, with the mask film 220 still covering sidewalls of the drain openings 218D, the semiconductor plug 224 may be selectively deposited in the extended source opening 2180 using molecular beam epitaxy (MBE), vapor-phase epitaxy (VPE), ultra-high vacuum CVD (UHV-CVD)), and/or other suitable epitaxial growth processes. The semiconductor plug 224 may be formed of silicon (Si) or silicon germanium (SiGe). In embodiments where the semiconductor plug 224 is formed of silicon germanium, a germanium concentration of the semiconductor plug 224 is smaller than a germanium concentration of the third semiconductor layer 206 to ensure the ability to selectively remove the third semiconductor layer 206 in a subsequent process. After the formation of the semiconductor plug 224, the mask film 220 covering the drain openings 218D is selectively removed using a suitable etch process.

In embodiments represented in FIG. 5, the semiconductor plug 224 reduces the depth of the extended source opening 2180 such that the plugged and extended source opening 2180 has a depth similar to that of the drain openings 218D. In these embodiments, the semiconductor plug 224 extends from the second semiconductor layer 204 and through the third semiconductor layer 206. A top surface of the semiconductor plug 224 may be higher than or at the same level with the interface between the third semiconductor layer 206 and the fourth semiconductor layer 208.

Figure 6:
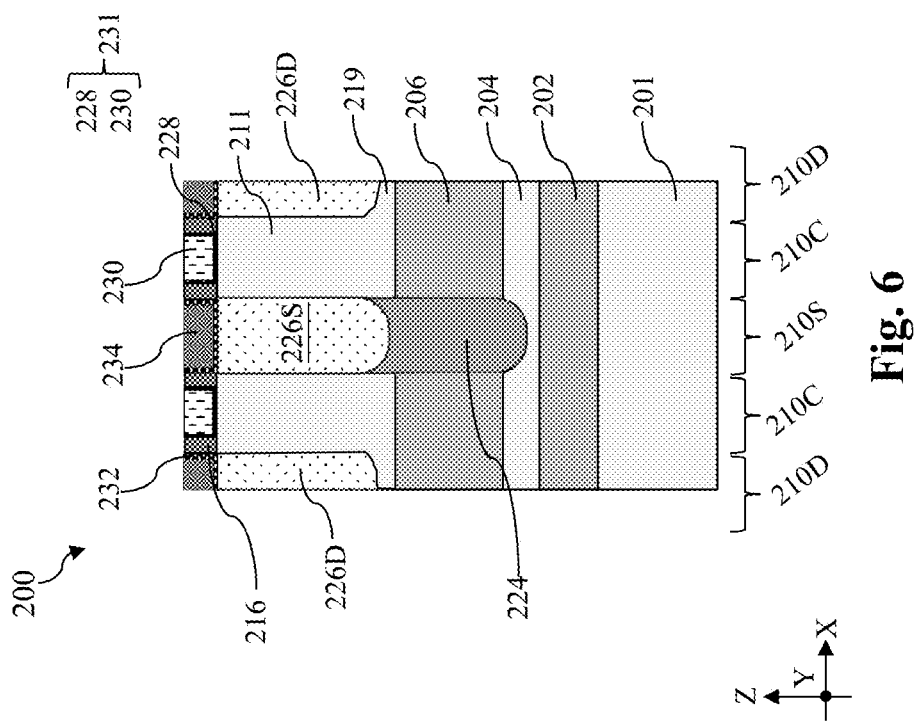

Referring to FIGS. 1 and 6, method 100 includes a block 114 where a source feature 226S is formed in the source opening 218S and a drain feature 226D is formed in the drain opening 218D. In some embodiments, the source feature 226S and the drain feature 226D may be deposited using an epitaxial process, such as VPE, UHV-CVD, MBE, and/or other suitable processes. The epitaxial growth process may use gaseous and/or liquid precursors, which interact with the composition of the fourth semiconductor layer 208 and the semiconductor plug 224. The source feature 226S and the drain feature 226D are therefore coupled to the channel regions 210C of the fin structure 210. Depending on the conductivity type of the to-be-formed transistor, the source feature 226S and the drain feature 226D may be n-type source/drain features or p-type source/drain features. Example n-type source/drain features may include silicon (Si), phosphorus-doped silicon (Si:P), arsenic-doped silicon (Si:As), antimony-doped silicon (Si:Sb), or other suitable material and may be in-situ doped during the epitaxial process by introducing an n-type dopant, such as phosphorus (P), arsenic (As), or antimony (Sb) or ex-situ doped using an implantation process (i.e., a junction implant process). Example p-type source/drain features may include germanium (Ge), gallium-doped silicon germanium (SiGe: Ga), boron-doped silicon germanium (SiGe:B), or other suitable material and may be in-situ doped during the epitaxial process by introducing a p-type dopant, such as boron (B) or gallium (Ga), or ex-situ doped using an implantation process (i.e., a junction implant process). Because the drain openings 218D do not extend into the third semiconductor layer 206, the drain features 226D also do not extend into the third semiconductor layer 206. As shown in FIG. 6, the drain features 226D are spaced apart from the third semiconductor layer 206 by a bottom semiconductor feature 219. The bottom semiconductor feature 219 is a portion of the fin structure 210 and is integral with the fin structure 210 in the channel region 210C. For ease of the reference, the channel regions 210C of the fin structures 210 may be referred to as channel structures 211. Each of the channel structures 211 is disposed between a source feature 226S and a drain feature 226D.

Referring to FIGS. 1 and 6, method 100 includes a block 116 where the dummy gate stacks 213 are replaced with gate structures 231. Operations at block 122 include deposition of a contact etch stop layer (CESL) 232, deposition of an interlayer dielectric (ILD) layer 234, removal of the dummy gate stacks 213, formation of gate structures 231, and a planarization of the workpiece 200 to remove excess materials. The CESL 232 may include silicon nitride, silicon oxynitride, and/or other materials known in the art and may be formed by ALD, plasma-enhanced chemical vapor deposition (PECVD) process and/or other suitable deposition or oxidation processes. As shown in FIG. 6, the CESL 232 may be deposited on top surfaces of the source feature 226S and the drain features 226D, and sidewalls of the gate spacer layer 216. The ILD layer 234 is then deposited by a PECVD process or other suitable deposition technique over the workpiece 200 after the deposition of the CESL 232. The ILD layer 234 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, after formation of the ILD layer 234, the workpiece 200 may be annealed to improve integrity of the ILD layer 234. To remove excess materials and to expose top surfaces of the dummy gate stacks 213, a planarization process, such a chemical mechanical polishing (CMP) process may be performed to the workpiece 200.

With the exposure of the dummy gate stacks 213, block 116 proceeds to removal of the dummy gate stacks 213. The removal of the dummy gate stacks 213 may include one or more etching processes that are selective to the material in the dummy gate stacks 213. For example, the removal of the dummy gate stacks 213 may be performed using as a selective wet etch, a selective dry etch, or a combination thereof. After the removal of the dummy gate stacks 213, sidewalls and top surfaces of the channel structures 211 are exposed. The gate structure 231 are deposited to wrap over the channel structures 211. Each of the gate structure 231 includes a gate dielectric layer 228 and a gate electrode layer 230 over the gate dielectric layer 228. In some embodiments, the gate dielectric layer 228 includes an interfacial layer disposed on the channel structures 211 and a high-k dielectric layer over the interfacial layer. Here, a high-k dielectric layer refers to a dielectric material having a dielectric constant greater than that of silicon dioxide, which is about 3.9. In some embodiments, the interfacial layer includes silicon oxide and may be formed in a pre-clean process. An example pre-clean process may include use of RCA SC-1 (a mixture of ammonium hydroxide, hydrogen peroxide and water) and/or RCA SC-2 (a mixture of hydrochloric acid, hydrogen peroxide and water). The high-K dielectric layer is then deposited over the interfacial layer using ALD, CVD, and/or other suitable methods. The high-k dielectric layer may include hafnium oxide. Alternatively, the high-k dielectric layer may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material.

The gate electrode layer 230 is then deposited over the gate dielectric layer 228 using ALD, PVD, CVD, e-beam evaporation, or other suitable methods. The gate electrode layer 230 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer 230 may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. Further, where the semiconductor device 200 includes n-type transistors and p-type transistors, different gate electrode layers may be formed separately for n-type transistors and p-type transistors, which may include different work function metal layers (e.g., for providing different n-type and p-type work function metal layers).

Figure 7:
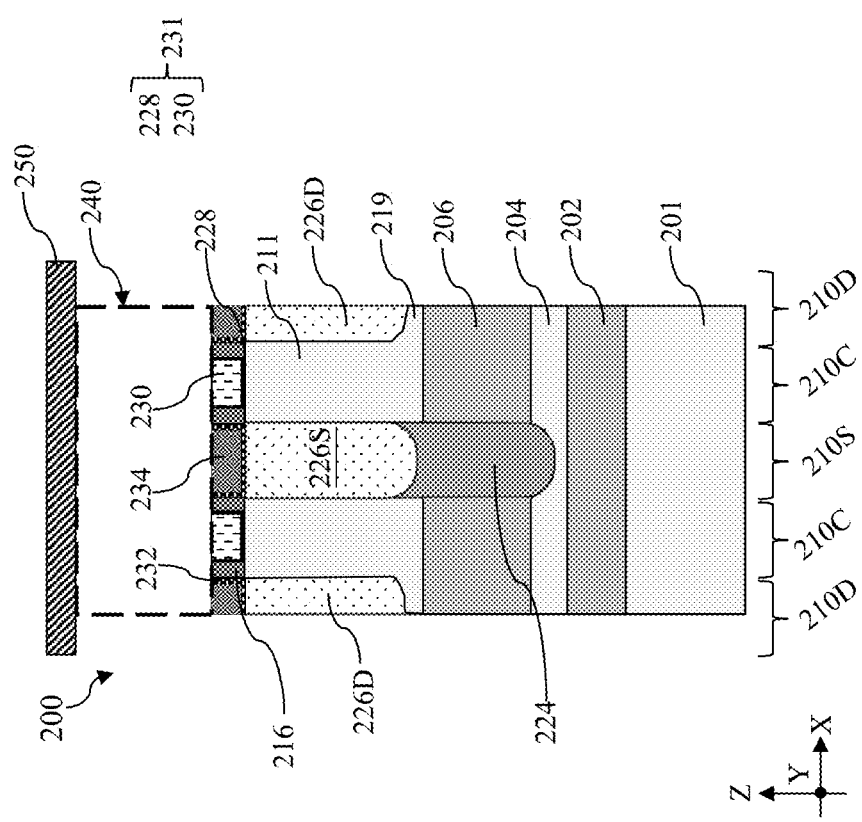

Referring to FIGS. 1 and 7, method 100 includes a block 118 where a first interconnect structure 240 over the workpiece 200. In some embodiments, the first interconnect structure 240 may include multiple intermetal dielectric (IMD) layers and multiple metal lines or contact vias in each of the IMD layers. In some instances, the IMD layers and the ILD layer 234 may share similar composition. The metal lines and contact vias in each IMD layer may be formed of metal, such as aluminum (Al), tungsten (W), ruthenium (Ru), or copper (Cu). In some embodiments, the metal lines and contact vias may be lined by a barrier layer to insulate the metal lines and contact vias from the IMD layers and to prevent electro-migration. Because the first interconnect structure 240 is formed over the front side of the workpiece 200, the first interconnect structure 240 may also be referred to as a frontside interconnect structure 240.

Figure 8:
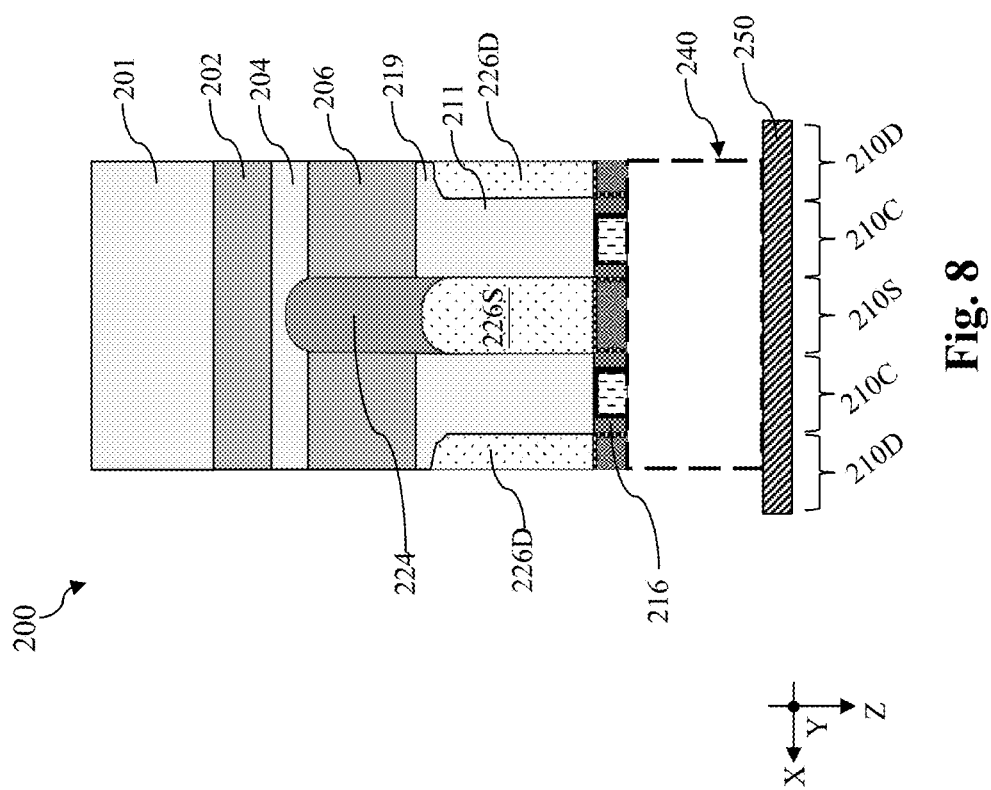

Referring to FIGS. 1, 7 and 8, method 100 includes a block 120 where a carrier substrate 250 is bonded to the first interconnect structure 240 and the workpiece 200 is flipped over. In some embodiments, the carrier substrate 250 may bonded to the workpiece 200 by fusion bonding, by use of an adhesion layer, or a combination thereof. In some instances, the carrier substrate 250 may be formed of semiconductor materials (such as silicon), sapphire, glass, polymeric materials, or other suitable materials. In embodiments where fusion bonding is used, the carrier substrate 250 includes a bottom oxide layer and the first interconnect structure 240 includes a top oxide layer. After both the bottom oxide layer and top oxide layer are treated, they are placed in plush contact with one another for direct bonding at room temperature or at an elevated temperature. Once the carrier substrate 250 is bonded to the first interconnect structure 240 of the workpiece 200, the workpiece 200 is flipped over, as shown in FIG. 7. As illustrated in FIG. 8, after the workpiece 200 is flipped over, the substrate 201 is at the top and is disposed over the first semiconductor layer 202.

Figure 9:
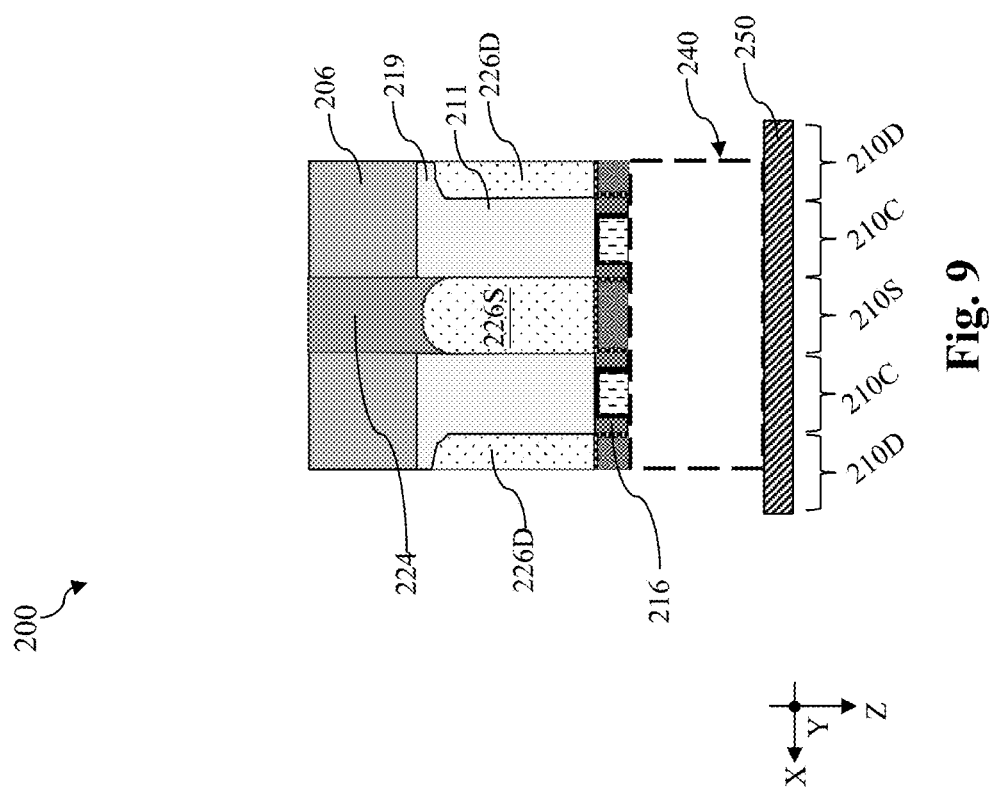

Referring to FIGS. 1 and 9, method 100 includes a block 122 where a back side of the workpiece 200 is planarized to remove the substrate 201, the first semiconductor layer 202, and the second semiconductor layer 204. In some embodiment, a CMP process may be performed at block 122 until a top surface of the third semiconductor layer 206 is level with the isolation feature (not explicitly shown). In some instances, a portion of the third semiconductor layer 206 and the isolation feature may also be removed at block 122.

Figure 10:
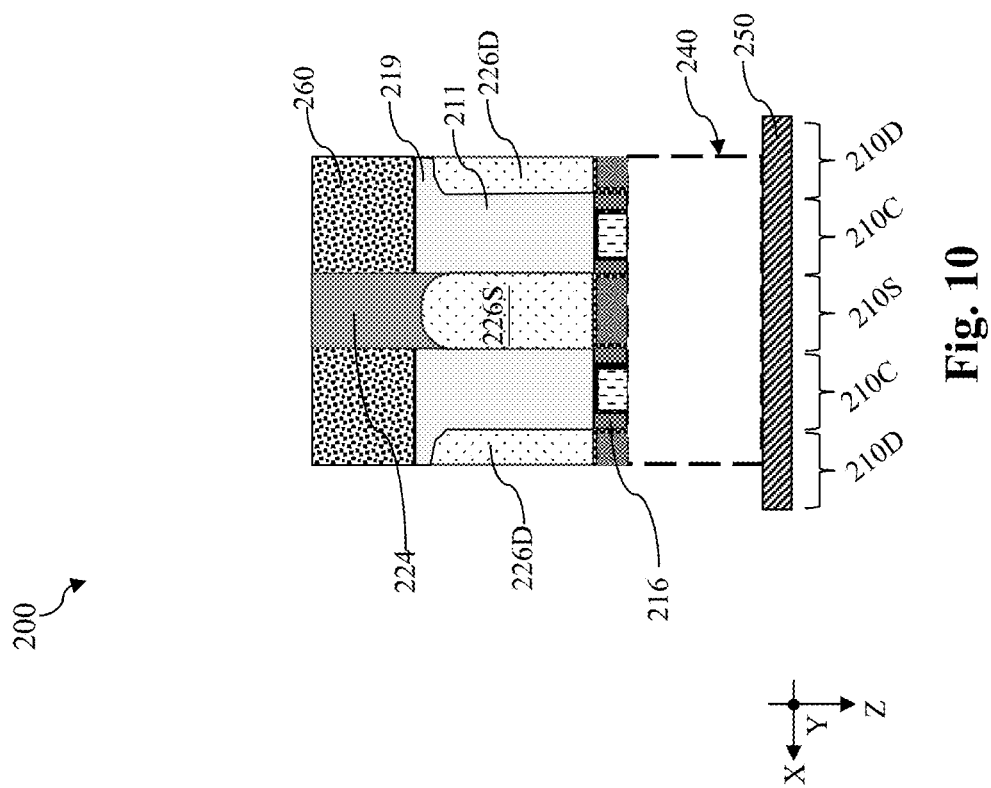

Referring to FIGS. 1 and 10, method 100 includes a block 124 where the third semiconductor layer 206 is replaced with a dielectric layer 260. In embodiments where the third semiconductor layer 206 is formed of silicon germanium (SiGe) and the semiconductor plug 224 is formed of silicon (Si) or silicon-rich, the third semiconductor layer 206 may serve as a sacrificial layer and may be selectively removed without substantially damaging the semiconductor plug 224 or the isolation feature. In some implementations, the selective removal of the third semiconductor layer 206 may be implemented by selective dry etch, selective wet etch, or other selective etch processes. The selective wet etching may include an APM etch (e.g., an etch process using RCA SC-1). In some embodiments, the selective removal may include SiGe oxidation followed by a SiGeOx removal. For example, the SiGe oxidation may be realized by ozone clean and then SiGeOx is removed by an etchant such as $NH_4OH$. After the third semiconductor layer 206 is selectively removed, the dielectric layer 260 may be deposited over a back side of the workpiece 200 by FCVD, CVD, PECVD, spin-on coating, or a suitable process. In some instances, the dielectric layer 260 may include silicon oxide or have a composition similar to that of the ILD layer 234. As shown in FIG. 10, after the dielectric layer 260 is formed, the drain features 226D are spaced apart from the dielectric layer 260 by the bottom semiconductor feature 219. As described above, the bottom semiconductor feature 219 is a portion of the fin structure 210 and is integral with the channel structures 211. The channel structures 211 serves as a channel or a channel structure of FinFET 1000 shown in FIG. 13.

As can be seen from FIG. 10, operations at block 124 replace the third semiconductor layer 206 with the dielectric layer 260. After the deposition of the dielectric layer 260, a planarization process, such as a CMP process, may be performed to planarize the back side of the workpiece 200.

After the planarization process, the semiconductor plug 224 is embedded in the dielectric layer 260 and the isolation feature and may be the only semiconductor feature exposed from the back side of the workpiece 200.

Figure 11:
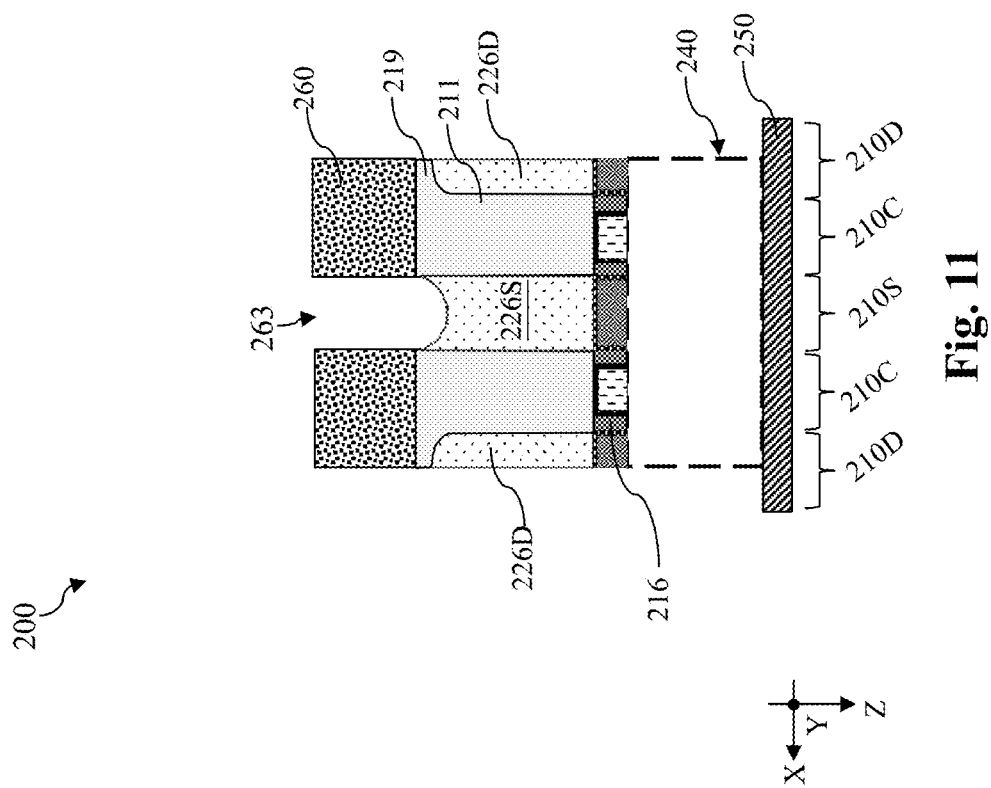
Figure 12:
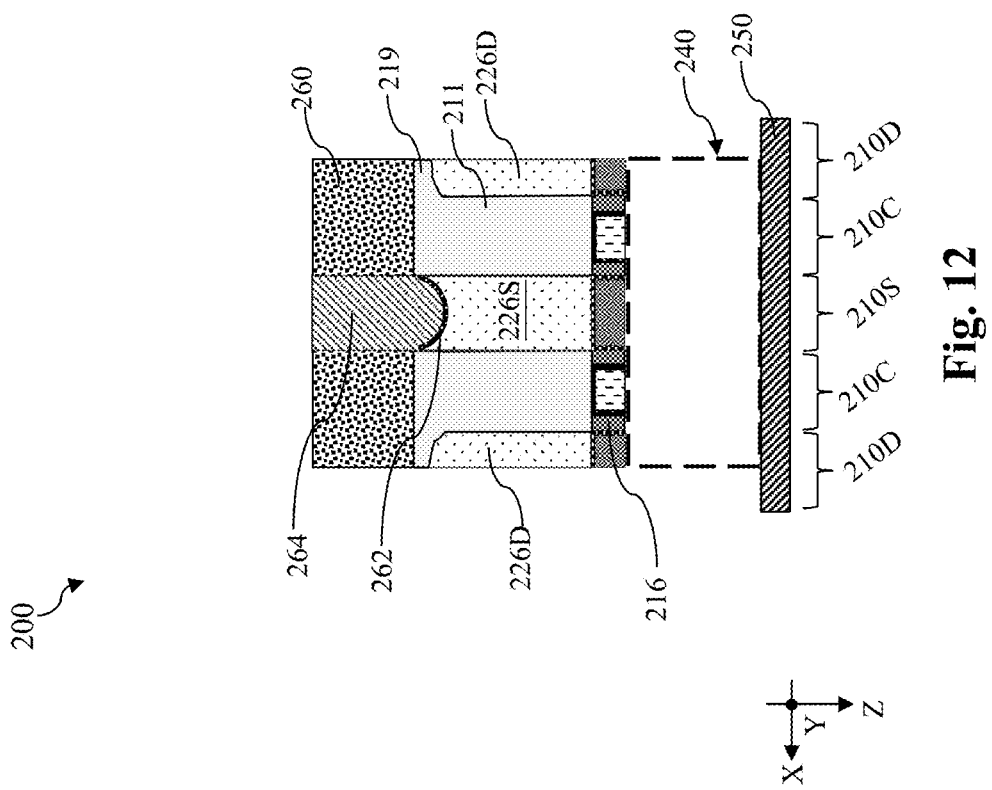

Referring to FIGS. 1, 11 and 12, method 100 includes a block 126 where the semiconductor plug 224 is replaced with a backside source contact 264. In some embodiments, operations at block 126 may include selective removal of the semiconductor plug 224 (shown in FIG. 11), formation of a silicide layer 262 over the source feature 226S (shown in FIG. 12), and formation of the backside source contact 264 on the silicide layer 262 (shown in FIG. 12). In some embodiments, the selective removal of the semiconductor plug 224 may be self-aligned because the semiconductor plug 224, which is formed of a semiconductor material, is disposed among the dielectric layer 260 and the isolation feature, both of which are formed of dielectric materials. In these embodiments, the selective removal of the semiconductor plug 224 may be performed using a selective wet etch process or a selective dry etch process. An example selective wet etch process may include use of nitric acid. An example selective dry etch process may include use of an oxygen-containing gas, hydrogen, a fluorine-containing gas (e.g., $NF_3$, $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. Because the selective etch process at block 126 etches the semiconductor plug 224 faster than it etches the dielectric layer 260 or the isolation feature, the semiconductor plug 224 may be removed without little or no damages to the dielectric layer 260 or the isolation feature. As shown in FIG. 11, after the semiconductor plug 224 is selectively removed, the source feature 226S is exposed in a backside source contact opening 263 disposed on the back side of the workpiece 200.

Reference is now made to FIG. 12. To reduce contact resistance between the source feature 226S and the backside source contact 264, the silicide layer 262 may be formed on the exposed surface of the source feature 226S in the backside source contact opening 263. To form the silicide layer 262, a metal layer is deposited over the exposed surfaces of the source feature 226S and an anneal process is performed to bring about silicidation reaction between the metal layer and the source feature 226S. Suitable metal layer may include titanium (Ti), tantalum (Ta), nickel (Ni), cobalt (Co), or tungsten (W). The silicide layer 262 may include titanium silicide (TiSi), titanium silicon nitride (TiSiN), tantalum silicide (TaSi), tungsten silicide (WSi), cobalt silicide (CoSi), or nickel silicide (NiSi). In embodiments where the source feature 226S includes germanium, the silicide layer 262 may also include metal germanide, such as titanium germanide (TiGe), titanium germanide nitride (TiGeN), tantalum germanide (TaGe), tungsten germanide (WGe), cobalt germanide (CoGe), or nickel germanide (NiGe). The silicide layer 262 generally tracks the shape of the source feature 226S. Although not explicitly shown, the excess metal layer that does not form the silicide layer 262 may be removed.

Reference is still made to FIG. 12. After the formation of the silicide layer 262, a metal fill layer may be deposited into the backside source contact opening 263 to form the backside source contact 264. The metal fill layer may include aluminum (Al), rhodium (Rh), ruthenium (Ru), copper (Cu), iridium (Ir), or tungsten (W). A planarization process, such as a CMP process, may follow to remove excess materials and provide a planar top surface. The backside source contact 264 is in direct contact with the silicide layer 262 and is electrically coupled to the source feature 226S by way of the silicide layer 262. In other words, the silicide layer 262 is sandwiched between the source feature 226S and the backside source contact 264.

Figure 13:
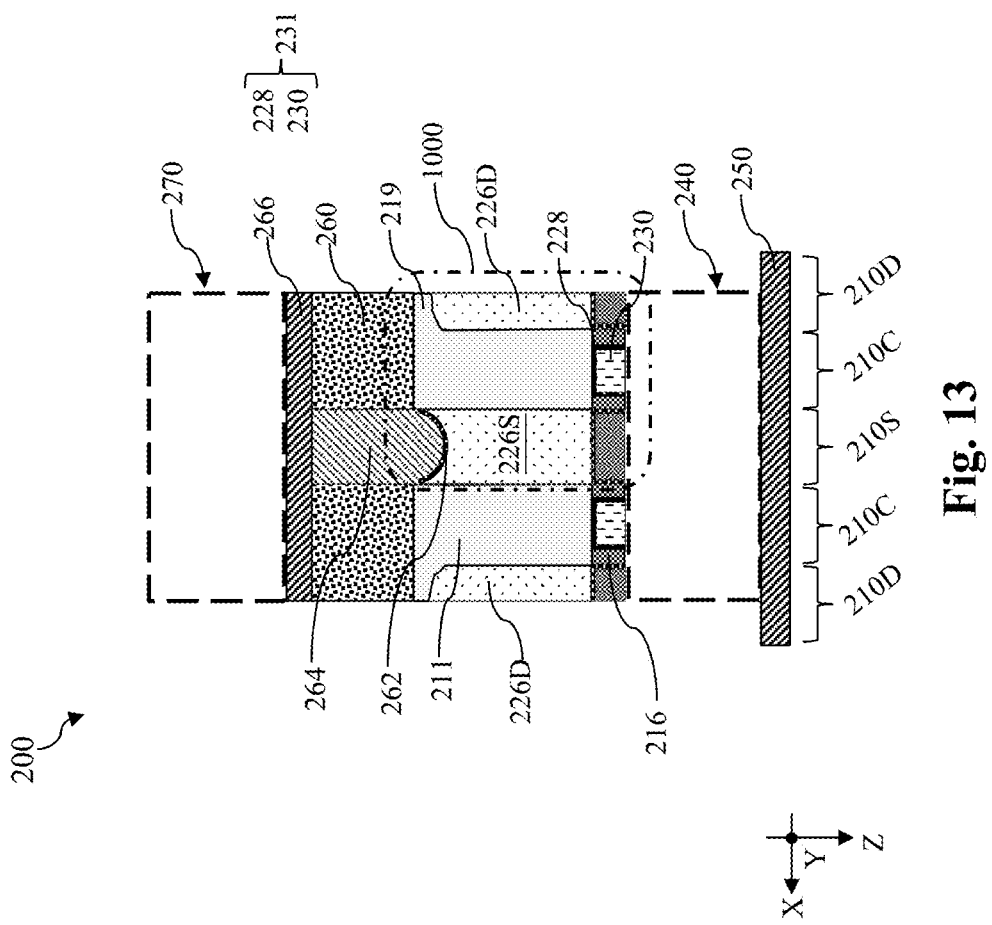

Referring to FIGS. 1 and 13, method 100 includes a block 128 where a backside power rail 266 is formed. While not explicitly shown in FIG. 13, the backside power rail 266 may be embedded in an insulation layer. In an example process, an insulation layer having a composition similar to the ILD layer 234 may be deposited over the backside of the workpiece 200, including over the dielectric layer 260, the isolation feature, and the backside source contact 264. Then, a power rail trench may be patterned in the insulation layer. A barrier layer and a metal fill material are then deposited into the power rail trench to form the backside power rail 266. In some embodiments, the barrier layer in the backside power rail 266 may include titanium nitride, tantalum nitride, cobalt nitride, nickel nitride, or tungsten nitride and the metal fill material in the backside power rail 266 may include titanium (Ti), ruthenium (Ru), copper (Cu), nickel (Ni), cobalt (Co), tungsten (W), tantalum (Ta), or molybdenum (Mo). The barrier layer and the metal fill layer may be deposited using PVD, CVD, ALD, or electroless plating. A planarization process, such as a CMP process, may be performed to remove excess materials over the insulation layer.

Referring to FIGS. 1 and 13, method 100 includes a block 130 where a second interconnect structure 270 is formed. In some embodiments, like the first interconnect structure 240, the second interconnect structure 270 may include multiple intermetal dielectric (IMD) layers and multiple metal lines or contact vias in each of the IMD layers. In some instances, the IMD layers and the ILD layer 234 may share similar composition. The metal lines and contact vias in each IMD layer may be formed of metal, such as aluminum (Al), tungsten (W), ruthenium (Ru), or copper (Cu). In some embodiments, the metal lines and contact vias may be lined by a barrier layer to insulate the metal lines and contact vias from the IMD layers and to prevent electro-migration. Because the second interconnect structure 270 is formed over the back side of the workpiece 200, the second interconnect structure 270 may also be referred to as a backside interconnect structure 270.

Figure 14:
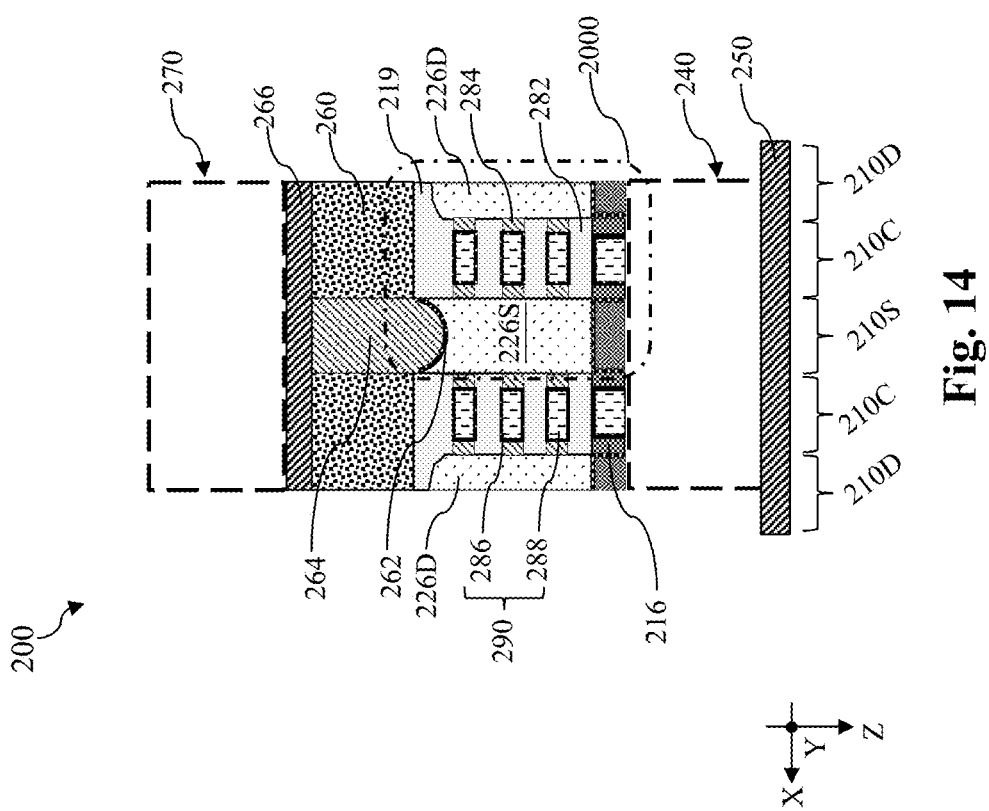
FIG. 14 illustrate an alternative semiconductor structure fabricated using the method of FIG. 1, according to one or more aspects of the present disclosure.

While operations of method 100 are described above with respect to formation of a FinFET 1000 shown in FIG. 13, method 100 of the present disclosure may be applied to formation of an MBC transistor 2000 shown in FIG. 14. Due to structural differences between the FinFET 1000 and the MBC transistor 2000, operations of method 100 may be different at different blocks. Some examples of such different operations are described below. At block 102, in order to form the MBC transistor 2000, the fourth semiconductor layer 208 of the composite substrate 209 may be replaced with a stack that includes a plurality of silicon channel layers interleaved by a plurality of SiGe sacrificial layers. At block 104, the fin structure 210 is formed from the stack, rather than the fourth semiconductor layer 208, and may be referred to as a fin-shaped structure due to the layers contained therein. At block 108, sidewalls of the silicon channel layers and the SiGe sacrificial layers are exposed in the source opening 218S and the drain opening 218D. Block 108 may further include operations to form inner spacer features 284 (shown in FIG. 14). In an example process, the SiGe sacrificial layers exposed in the source opening 218S and the drain opening 218D are partially and selectively recessed to form inner spacer recesses. Then inner spacer features 284 (shown in FIG. 14) are deposited into the inner spacer recesses. At block 116, after the dummy gate stacks 213 (shown in FIG. 4) are removed, the SiGe sacrificial layers are selectively removed to release the silicon channel layers as channel members 282 (shown in FIG. 14). As illustrated in FIG. 14, the channel members 282 in a channel region 210C are vertically stacked along the Z direction and horizontally extend between a source feature 226S and a drain feature 226D along the X direction. After the channel members 282 are released, an MBC gate structure 290 is deposited to wrap around each of the channel members 282 in the channel region 210C. The MBC gate structure 290 includes an MBC gate dielectric layer 286 and an MBC gate electrode layer 288. In terms of compositions, the MBC gate dielectric layer 286 may be similar to the gate dielectric layer 228 and the MBC gate electrode layer 288 may be similar to the gate electrode layer 230.

Figure 15:
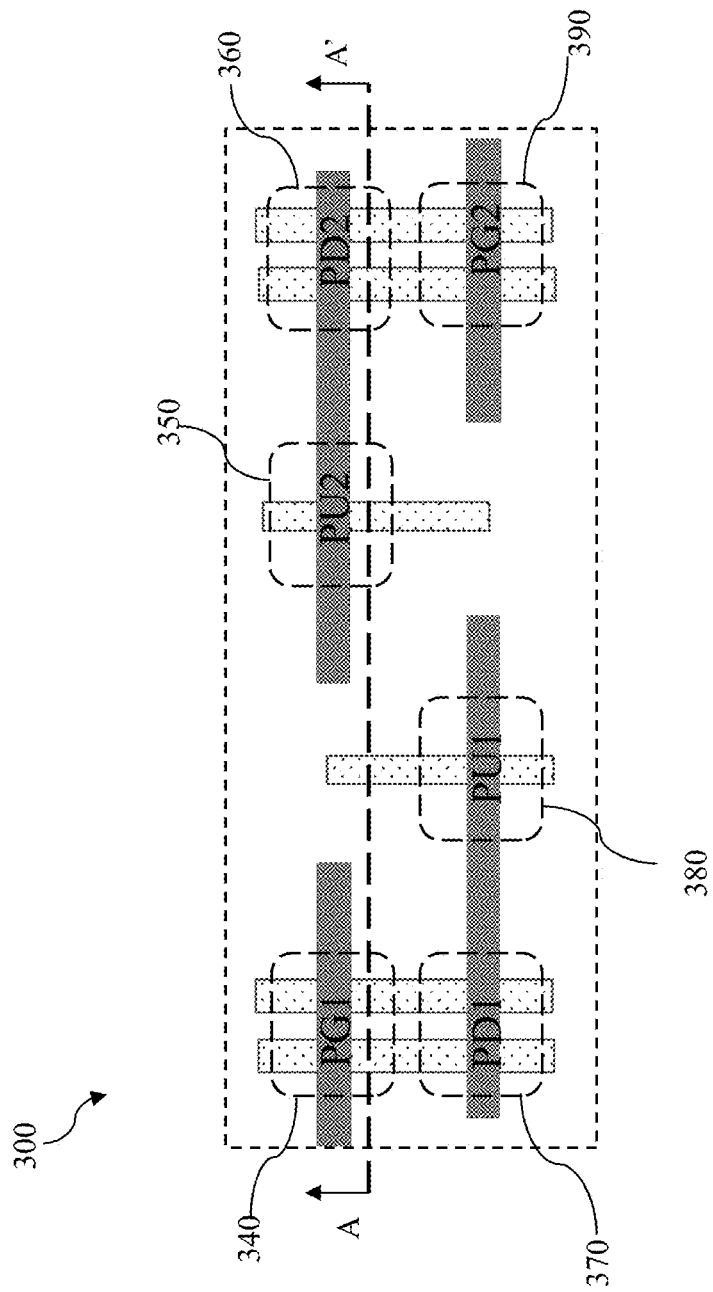
FIG. 15 illustrates top view of a Static Random Access Memory (SRAM) cell, according to one or more aspects of the present disclosure.
Figure 16:
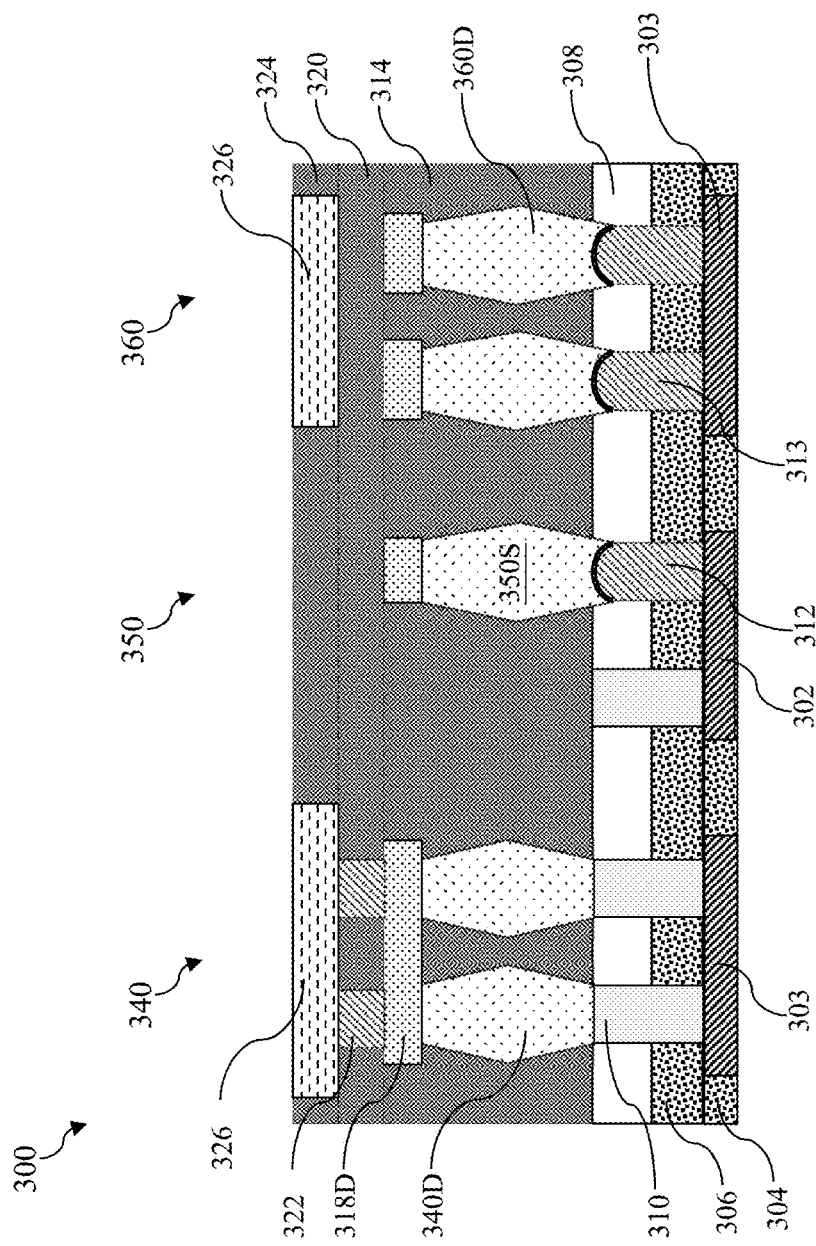
FIG. 16 illustrates a cross-sectional view of the Static Random Access Memory (SRAM) cell in FIG. 15, according to one or more aspects of the present disclosure.

Structures of the present disclosure may be applied in a Static Random Access Memory (SRAM) cell, such as an SRAM cell 300 shown in FIGS. 15 and 16. In the top view illustrated in FIG. 15, the SRAM cell 300 includes six transistors serving as a first pass-gate transistor (PG1) 340, a second pass-gate transistor (PG2) 390, a first pull-up transistor (PU1) 380, a second pull-up transistor (PU2) 350, a first pull-down transistor (PD1) 370, and a second pull-down transistor (PD2) 360. Due to the number of transistors, the SRAM cell 300 may be referred to as a 6-transistor (6T) SRAM cell. In the depicted embodiments, the first pull-up transistor (PU1) and the second pull-up transistor (PU2) 350 are p-type single-fin FinFETs; the first pull-down transistor (PD1), the first pass-gate transistor (PG1) 340, the second pull-down transistor (PD2) 360 and the second pass-gate transistor (PG2) are n-type double-fin FinFETs. A layout of a 6T SRAM cell is described in U.S. Patent Application Publication No. 2014/0153321, which is incorporated by reference herein in its entirety. FIG. 16 illustrates a fragmentary cross-sectional view of the SRAM cell 300 along section A-A' shown in FIG. 15. Section A-A' cuts across the first pass-gate transistor (PG1) 340, the second pull-up transistor (PU2) 350 and the second pull-down transistor (PD2) 360. For clarity of illustration, some features illustrated in FIG. 16 are not shown in FIG. 15.

Referring to FIG. 16, the SRAM cell 300 includes frontside bit lines (or bit line bar) 326, a backside power rail 302 coupled to power supply voltage (Vdd), and a backside ground rail 303 coupled to the ground potential (Vss). The bit lines 326 are disposed in an intermetal dielectric (IMD) layer 324 and are electrically coupled to drain contact vias 322 disposed in a second interlayer dielectric (ILD) layer 320. The bit lines 326 may be electrically coupled to a drain contact 318D. The drain contact 318D are embedded in a first ILD layer 314 and coupled to drain features 340D of the first pass-gate transistor (PG1) 340. A silicon base portion 310 of the first pass-gate transistor (PG1) 340 extends through an isolation feature 308 and a backside dielectric layer 306. A source feature 350S of the second pull-up transistor (PU2) 350 is coupled to the backside power rail 302 by way of a backside source contact 312. A drain feature 360D of the second pull-down transistor (PD2) 360 is coupled to the backside ground rail 303 by way of a backside drain contact 313. The backside source contact 312 and the backside drain contact 313 extend vertically through the isolation feature 308 and the backside dielectric layer 306. In terms of materials and formation processes, the backside source contact 312 and the backside drain contact 313 may be similar to the backside source contact 264 shown in FIG. 13 and the backside power rail 302 and backside ground rail 303 may be similar to the backside power rail 266 illustrated in FIG. 13. The backside power rail 302 and the backside ground rail 303 are disposed in a dielectric layer 304.

Embodiments of the present disclosure provide advantages. For example, methods of the present disclosure include forming a composite substrate that includes different semiconductor layers of various thicknesses. Because the composite substrate is formed using epitaxial deposition, the thickness and depth of each layer may be better controlled than those of an insulation layer in an SOI substrate. As a result, method of the present disclosure may reduce process variation and improve yield. Additionally, because cost associated with a composite substrate is smaller than that associated with an SOI substrate, methods of the present disclosure may reduce manufacturing cost.

In one exemplary aspect, the present disclosure is directed to a method. The method includes forming a composite substrate that includes a substrate, a first semiconductor layer over the substrate, a second semiconductor layer over the first semiconductor layer, a third semiconductor layer over the second semiconductor layer, and a fourth semiconductor layer over the third semiconductor layer, forming a fin structure from the fourth semiconductor layer, forming a dummy gate stack over a channel region of the fin structure, recessing a source region and a drain region of the fin structure to form a source opening and a drain opening, the channel region being disposed between the source region and the drain region, selectively etching the source region of the fin structure to extend the source opening through the third semiconductor layer to form an extended source opening, selectively forming a semiconductor plug into the extended source opening, planarizing the composite substrate to remove the substrate, the first semiconductor layer, and the second semiconductor layer to expose the semiconductor plug, after the planarizing, replacing the third semiconductor layer with a dielectric layer, and replacing the semiconductor plug with a backside source contact.

In some embodiments, the first semiconductor layer and the third semiconductor layer have the same composition and the second semiconductor layer and the fourth semiconductor layer have the same composition. In some implementations, the first semiconductor layer includes silicon germanium, the second semiconductor layer includes silicon, the third semiconductor layer includes silicon germanium, and the fourth semiconductor layer includes silicon. In some instances, the source opening and the drain opening do not extend into the third semiconductor layer. In some embodiments, the extended source opening terminates in the second semiconductor layer. In some implementations, the selectively etching of the source region includes masking the drain opening with a photoresist layer. In some instances, the semiconductor plug includes silicon. In some embodiments, the replacing of the semiconductor plug with the backside source contact includes selectively etching the semiconductor plug without substantially etching the dielectric layer.

In another exemplary aspect, the present disclosure is directed to a method. The method includes forming a composite substrate that includes a substrate, a first silicon germanium (SiG) layer over the substrate, a first silicon (Si) layer over the first SiGe layer, a second SiGe layer over the first Si layer, and a second Si layer over the second SiGe layer, forming a fin structure from the second Si layer, forming a dummy gate stack over a channel region of the fin structure, recessing a source region and a drain region of the fin structure to form a source opening and a drain opening, the channel region being disposed between the source region and the drain region, selectively etching the source region of the fin structure to extend the source opening through the second SiGe layer to form an extended source opening, selectively forming a Si plug into the extended source opening, after the selective forming of the Si plug, forming a source feature over the Si plug and a drain feature in the drain opening, planarizing the composite substrate to remove the substrate, the first SiGe layer, and the first Si layer to expose the Si plug, after the planarizing, replacing the second SiGe layer with a dielectric layer, and replacing the Si plug with a backside source contact.

In some embodiments, the source opening and the drain opening do not extend into the second SiGe layer. In some implementations, the extended source opening terminates in the first Si layer. In some embodiments, the selectively etching of the source region includes masking the drain opening with a photoresist layer. In some instances, the dielectric layer includes silicon oxide. In some embodiments, each of the first SiGe layer and the second SiGe layer includes a thickness between about 25 nm and about 35 nm. In some instances, the replacing of the Si plug with the backside source contact includes selectively etching the Si plug to expose the source feature in a backside source contact opening. In some embodiments, the replacing of the Si plug with the backside source contact further includes selectively forming a silicide layer over the exposed source feature, and depositing a metal fill layer in the backside source contact opening.

In yet another exemplary aspect, the present disclosure is directed to a semiconductor structure. The semiconductor structure includes a source feature and a drain feature, a channel structure disposed between the source feature and the drain feature, a dielectric layer disposed over the drain feature, a backside source contact over the source feature and extending through the dielectric layer; and a backside power rail disposed over the dielectric layer and in contact with the backside source contact.

In some embodiments, the semiconductor structure may further include a silicide layer sandwiched between the source feature and the backside source contact. In some instances, the drain feature is spaced apart from the dielectric layer by a bottom semiconductor feature and the bottom semiconductor feature is integral with the channel structure. In some implementations, the bottom semiconductor feature includes silicon.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a first bottom semiconductor feature and a second bottom semiconductor feature disposed on a backside dielectric layer;
    a first vertical stack of nanostructures disposed over the first bottom semiconductor feature;
    a second vertical stack of nanostructures disposed over the second bottom semiconductor feature;
    a first epitaxial source/drain feature extending between the first vertical stack of nanostructures and the second vertical stack of nanostructures along a direction; and
    a backside contact extending through the backside dielectric layer to couple to the first epitaxial source/drain feature,
    wherein a portion of the backside contact extends between the first bottom semiconductor feature and the second bottom semiconductor feature along the direction.

2. The semiconductor structure of claim 1, further comprising:
    a second epitaxial source/drain feature coupled to sidewalls of the first vertical stack of nanostructures such that the first vertical stack of nanostructures extends between the first epitaxial source/drain feature and the second epitaxial source/drain feature,
    wherein the second epitaxial source/drain feature is spaced apart from the backside dielectric layer by a portion of the first bottom semiconductor feature.

3. The semiconductor structure of claim 1, further comprising:
    a first gate structure wrapping around each of the first vertical stack of nanostructures; and
    a second gate structure wrapping around each of the second vertical stack of nanostructures.

4. The semiconductor structure of claim 1, further comprising:
    a silicide layer sandwiched between the first epitaxial source/drain feature and the backside contact.

5. The semiconductor structure of claim 4, wherein the silicide layer comprises titanium silicide (TiSi), titanium silicon nitride (TiSiN), tantalum silicide (TaSi), tungsten silicide (WSi), cobalt silicide (CoSi), or nickel silicide (NiSi).

6. The semiconductor structure of claim 4, wherein the silicide layer comprises titanium germanide (TiGe), titanium germanide nitride (TiGeN), tantalum germanide (TaGe), tungsten germanide (WGe), cobalt germanide (CoGe), or nickel germanide (NiGe).

7. The semiconductor structure of claim 1, wherein the backside contact comprises aluminum (Al), rhodium (Rh), ruthenium (Ru), copper (Cu), iridium (Ir), or tungsten (W).

8. The semiconductor structure of claim 1, wherein the backside dielectric layer comprises silicon oxide.

9. A method, comprising:
    receiving a composite substrate that includes:
        a semiconductor substrate,
        a first silicon germanium (SiGe) layer over the semiconductor substrate,
        a first silicon (Si) layer over the first silicon germanium (SiGe) layer,
        a second SiGe layer over the first Si layer, and
        a second Si layer over the second SiGe layer;
    patterning the second Si layer to form a fin;
    forming a dummy gate stack over a channel region of the fin;
    recessing a source region and a drain region of the fin to form a source opening and a drain opening, the source region and the drain region sandwiching the channel region;
    depositing a mask film over the source opening, the dummy gate stack and the drain region;
    patterning the mask film to expose the source opening;
    after the patterning of the mask film, selectively extending the source opening through the second SiGe layer to form an extended source opening;

with the patterned mask film in place, forming a semiconductor plug in the extended source opening;
forming an epitaxial source feature over the semiconductor plug and an epitaxial drain feature in the drain opening;
planarizing the composite substrate from a surface of the semiconductor substrate until the semiconductor plug is exposed;
after the planarizing, replacing the second SiGe layer with a backside dielectric layer; and
replacing the semiconductor plug with a backside contact.

10. The method of claim 9, wherein the semiconductor substrate comprises silicon, germanium, silicon carbide (SiC), silicon germanium (SiGe), or diamond.

11. The method of claim 9,
wherein the first SiGe layer comprises a first thickness,
wherein the first Si layer comprises a second thickness,
wherein the second SiGe layer comprises a third thickness,
wherein the second Si layer comprises a fourth thickness,
wherein the fourth thickness is smaller than the third thickness,
wherein the first thickness is greater than the second thickness.

12. The method of claim 11,
wherein the first thickness is between about 25 nm and about 30 nm,
wherein the second thickness is between about 5 nm and about 15 nm,
wherein the third thickness is between about 30 nm and about 35 nm,
wherein the fourth thickness is between about 50 nm and about 100 nm.

13. The method of claim 9, wherein the mask film comprises silicon oxide, silicon nitride, silicon oxynitride, silicon oxycarbonitride, silicon carbide, or silicon oxycarbide.

14. The method of claim 9, further comprising:
before the forming of the epitaxial source feature and the epitaxial drain feature, removing the mask film.

15. The method of claim 9, wherein the semiconductor plug comprises silicon germanium.

16. The method of claim 15, wherein a germanium content in the semiconductor plug is smaller than a germanium content in the second SiGe layer.

17. The method of claim 9, wherein the replacing of the second SiGe layer comprises:
selectively removing the second SiGe layer using a wet etch process without substantially damaging the semiconductor plug; and
after the selectively removing, depositing the backside dielectric layer over the semiconductor plug.

18. A method, comprising:
receiving a composite substrate that includes:
a semiconductor substrate,
a first silicon germanium (SiGe) layer over the semiconductor substrate,
a silicon (Si) layer over the first silicon germanium (SiGe) layer,
a second SiGe layer over the Si layer, and
a semiconductor layer stack over the second SiGe layer, the semiconductor layer stack comprising a plurality of channel layers interleaved by a plurality of sacrificial layers;
patterning the semiconductor layer stack to form a fin-shaped structure;
forming a dummy gate stack over a channel region of the fin-shaped structure;
recessing a source region and a drain region of the fin-shaped structure to form a source opening and a drain opening, the source region and the drain region sandwiching the channel region;
depositing a mask film over the source opening, the dummy gate stack and the drain region;
patterning the mask film to expose the source opening;
after the patterning of the mask film, selectively extending the source opening through the second SiGe layer to form an extended source opening;
with the patterned mask film in place, forming a semiconductor plug in the extended source opening;
forming an epitaxial source feature over the semiconductor plug and an epitaxial drain feature in the drain opening;
planarizing the composite substrate from a surface of the semiconductor substrate until the semiconductor plug is exposed;
after the planarizing, replacing the second SiGe layer with a backside dielectric layer; and
replacing the semiconductor plug with a backside contact.

19. The method of claim 18, further comprising:
after the recessing, partially and selectively etching sidewalls of the plurality of sacrificial layers to form inner spacer recesses; and
forming inner spacer features in the inner spacer recesses.

20. The method of claim 18, further comprising:
removing the dummy gate stack;
selectively removing the plurality of sacrificial layers in the channel region to release the plurality of channel layers as a plurality of channel members; and
forming a gate structure to wrap around each of the plurality of channel members.

* * * * *